(12) United States Patent
Kang et al.

(10) Patent No.: US 9,252,274 B2
(45) Date of Patent: Feb. 2, 2016

(54) FIN FIELD EFFECT TRANSISTORS INCLUDING MULTIPLE LATTICE CONSTANTS AND METHODS OF FABRICATING THE SAME

(71) Applicant: Samsung Electronics Co., Ltd., Suwon-si, Gyeonggi-do (KR)

(72) Inventors: Myung Gil Kang, Seoul (KR); Changwoo Oh, Suwon-si (KR); Heedon Jeong, Hwaseong-si (KR); Chiwon Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 14/579,222

(22) Filed: Dec. 22, 2014

(65) Prior Publication Data

US 2015/0108545 A1    Apr. 23, 2015

Related U.S. Application Data

(62) Division of application No. 13/615,968, filed on Sep. 14, 2012, now Pat. No. 8,941,155.

(30) Foreign Application Priority Data

Mar. 6, 2012  (KR) .................. 10-2012-0022837

(51) Int. Cl.
*H01L 29/78* (2006.01)
*H01L 29/10* (2006.01)
*H01L 21/8238* (2006.01)
*H01L 29/66* (2006.01)

(52) U.S. Cl.
CPC ...... *H01L 29/785* (2013.01); *H01L 21/823821* (2013.01); *H01L 29/1054* (2013.01); *H01L 29/66795* (2013.01); *H01L 29/7848* (2013.01); *H01L 29/7851* (2013.01); *H01L 29/7856* (2013.01)

(58) Field of Classification Search
CPC ............... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/66803; H01L 29/6681; H01L 29/66818; H01L 29/785; H01L 29/7851; H01L 29/7853; H01L 29/7854; H01L 29/7855; H01L 29/7856
USPC ........................... 257/288–413; 438/197–308
See application file for complete search history.

(56) References Cited

U.S. PATENT DOCUMENTS 6,635,909 B2   10/2003   Clark et al.
6,888,181 B1    5/2005   Liao et al.
(Continued)

FOREIGN PATENT DOCUMENTS

KR   1020040094702 A   10/2004
KR   1020070019681 A    2/2007
(Continued)

*Primary Examiner* — Matthew Landau
*Assistant Examiner* — Eric Ward
(74) *Attorney, Agent, or Firm* — Myers Bigel Sibley & Sajovec, P.A.

(57) ABSTRACT

A Field Effect Transistor (FET) structure may include a fin on a substrate having a first lattice constant and at least two different lattice constant layers on respective different axially oriented surfaces of the fin, wherein the at least two different lattice constant layers each comprise lattice constants that are different than the first lattice constant and each other.

4 Claims, 21 Drawing Sheets

(56) References Cited

U.S. PATENT DOCUMENTS

| | | |
|---|---|---|
| 6,972,461 B1 | 12/2005 | Chen et al. |
| 7,045,401 B2 | 5/2006 | Lee et al. |
| 7,154,118 B2 | 12/2006 | Lindert et al. |
| 7,193,279 B2 | 3/2007 | Doyle et al. |
| 7,271,456 B2 | 9/2007 | Oh et al. |
| 7,646,070 B2 | 1/2010 | Anderson et al. |
| 7,683,436 B2 | 3/2010 | Nishiyama et al. |
| 7,705,345 B2 | 4/2010 | Bedell et al. |
| 7,799,592 B2 | 9/2010 | Lochtefeld |
| 7,821,061 B2 | 10/2010 | Jin et al. |
| 7,915,693 B2 | 3/2011 | Okano |
| 8,076,231 B2 | 12/2011 | Saitoh et al. |
| 8,237,226 B2 | 8/2012 | Okano |
| 8,263,451 B2 | 9/2012 | Su et al. |
| 8,420,459 B1 | 4/2013 | Cheng et al. |
| 8,551,829 B2 | 10/2013 | Chien et al. |
| 8,796,695 B2 | 8/2014 | Liao et al. |
| 2007/0075372 A1 | 4/2007 | Terashima et al. |
| 2008/0233697 A1 | 9/2008 | Huffman et al. |
| 2011/0057269 A1 | 3/2011 | Wilson et al. |
| 2011/0073952 A1 | 3/2011 | Kwok et al. |
| 2011/0084340 A1 | 4/2011 | Yuan et al. |
| 2011/0147840 A1 | 6/2011 | Cea et al. |
| 2011/0169101 A1 | 7/2011 | Doornbos et al. |
| 2011/0210404 A1* | 9/2011 | Su et al. .................. 257/401 |
| 2011/0298058 A1* | 12/2011 | Kawasaki et al. ........ 257/401 |
| 2012/0319211 A1* | 12/2012 | van Dal et al. ........... 257/401 |

FOREIGN PATENT DOCUMENTS

| | | |
|---|---|---|
| KR | 1020110040651 | 4/2011 |
| WO | WO 03/081640 A2 | 10/2003 |

* cited by examiner

FIN FIELD EFFECT TRANSISTORS INCLUDING MULTIPLE LATTICE CONSTANTS AND METHODS OF FABRICATING THE SAME

CROSS-REFERENCE TO RELATED APPLICATIONS

This application is a divisional of U.S. patent application Ser. No. 13/615,968, filed Sep. 14, 2012 and claims priority from 35 U.S.C. §119 to Korean Patent Application No. 10-2012-0022837, filed on Mar. 6, 2012, the disclosures of which are incorporated herein by reference in their entireties.

BACKGROUND

The inventive concept relates to fin field effect transistors and methods of fabricating the same.

As the size of the gate of a transistor becomes smaller, problems such as short channel effects may occur. It may be difficult to highly integrate a MOS transistor using MOS transistor fabrication techniques with a bulk silicon substrate. Thus, research has been done on the use of a silicon-on-insulator (SOI) substrate for MOS transistors. However, since the body of a MOS transistor using the SOI substrate is not connected to a substrate (i.e., the body silicon floats), the performance of the device may be reduced due to the floating body effect and due to low heat conduction.

Recently, a fin field effect transistor has been proposed. The fin field effect transistor may correspond to a double-gate transistor of which a gate electrode is disposed on both sides of a channel. Since the gate electrode of the fin field effect transistor is on both sides of the channel, the control characteristic of the gate electrode may be improved. Thus, leakage current between a source and a drain in the fin field effect transistor may be improved compared to a conventional single gate transistor, such that a drain induced barrier leakage (DIBL) characteristic of the fin field effect transistor may be improved. Additionally, since the threshold voltage may be changed by having the gate electrode on both sides of the channel, the on-off characteristic of the channel may be improved compared to the conventional single gate transistor and short channel effects may also be suppressed.

However, as the fin field effect transistor becomes more highly integrated due to the reduced size of the device, it may be more difficult to improve current driving ability of the fin field effect transistor.

SUMMARY

Embodiments according to the inventive concept can provide fin FET transistors including multiple lattice constant. Pursuant to these embodiments, a FET structure can include a fin on a substrate having a first lattice constant. At least two different lattice constant layers can be located on respective different axially oriented surfaces of the fin, wherein the at least two different lattice constant layers each have lattice constants that are different than the first lattice constant and each other.

In some embodiments according to the inventive concept, the at least two different lattice constant layers can be epi layers and the fin can extend from the substrate to protrude from a device isolation layer on the substrate to provide upper side walls of the fin to provide a first axially oriented surface and a top surface of the fin to provide a second axially oriented surface and a channel region. The structure can also include a gate structure that crosses over the fin opposite the channel region. A first epi layer can be on the top surface of the fin and have a second lattice constant different than the first lattice constant. A second epi layer can be on the upper side walls of the fin, and have a third lattice constant that is different than the first and second lattice constants.

In some embodiments according to the inventive concept, the first epi layer is absent from the upper side walls of the fin and the second epi layer extends between the upper sidewalls of the fin to cover the first epi layer. In some embodiments according to the inventive concept, the first epi layer covers the second epi layer on the upper side walls and the second epi layer is absent from the top surface of the fin.

In some embodiments according to the inventive concept, the fin can further include source/drain interfaces at opposing ends of the channel region, and source/drain regions can have a third epi layer having a fourth lattice constant that is different than the first, second, and third lattice constants, that extends from the source/drain interfaces outward from the gate structure to cover the top surface of the fin exposed by the gate structure.

In some embodiments according to the inventive concept, the fin includes source/drain interfaces at opposing ends of the channel region, and the structure can further include source/drain regions, having a third epi layer with a fourth lattice constant that is different than the first, second, and third lattice constants, that extends from the source/drain interfaces outward from the gate structure to cover the top surface of the fin exposed by the gate structure.

In some embodiments according to the inventive concept, the at least two different lattice constant layers can be epi layers and the fin extends from the substrate to protrude from a device isolation layer on the substrate to provide upper side walls of the fin, a top surface of the fin, a channel region the fin and source/drain interfaces of the fin at opposing ends of the channel region. The structure can further include a gate structure that crosses over the fin opposite the channel region and a first epi layer on the top surface of the fin having a second lattice constant that is different than the first lattice constant. Source/drain regions can provide a second epi layer having a third lattice constant that is different than the first and second lattice constants, extending from the source/drain interfaces outward from the gate structure to cover the top surface of the fin exposed by the gate structure.

In some embodiments according to the inventive concept, the fin can be Ge and the first epi layer can be Si or C. In some embodiments according to the inventive concept, the gate structure can include a gate insulating layer and a gate electrode on the gate insulating layer. In some embodiments according to the inventive concept, the gate insulating layer can be a silicon oxide and/or a high K dielectric. In some embodiments according to the inventive concept, the gate electrode can be doped polysilicon, metal silicide, and/or metal.

In some embodiments according to the inventive concept, a FET structure can include a device isolation layer on a substrate and a fin having a first lattice constant, where the fin extends from the substrate to protrude from the device isolation layer to provide upper side walls of the fin, a top surface of the fin, a channel region, and source/drain interfaces at opposing ends of the channel region. A gate structure can cross over the fin opposite the channel region between the source/drain interfaces. A first epi layer can be on the top surface of the fin and can have a second lattice constant different than the first lattice constant. A second epi layer can be on the upper side walls of the fin and on the first epi layer on the top surface, and can have a third lattice constant that is different than the first and second lattice constants. Source/ drain regions can provide a third epi layer that has a fourth lattice constant that is different than the first, second, and third lattice constants, and extends from the source/drain interfaces outward from the gate structure to cover the top surface of the fin exposed by the gate structure.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
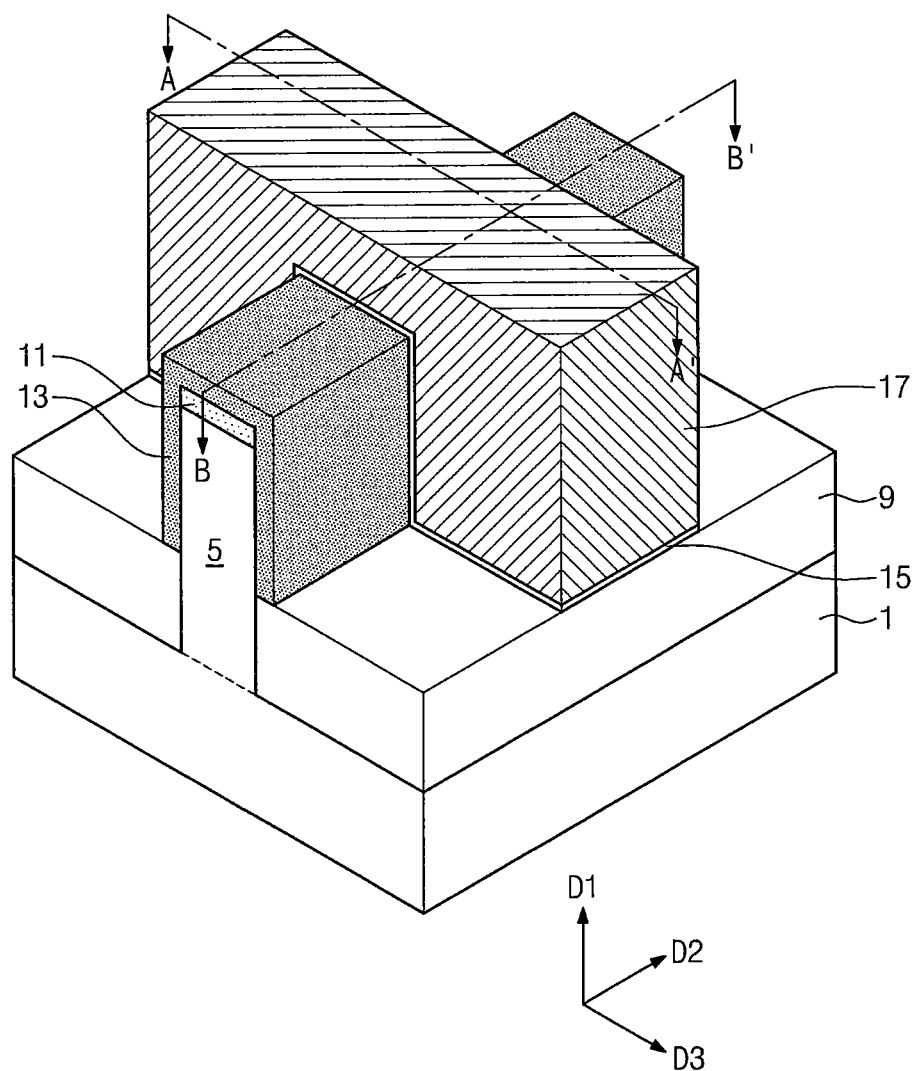
FIG. 1 is a perspective view illustrating a fin field effect transistor according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. The structures shown herein referred to as, for example, the fin or fin structures can be any active semiconductor layers, which are formed to have equivalent semiconductor properties as the fin or fin structures.

Figure 2A:
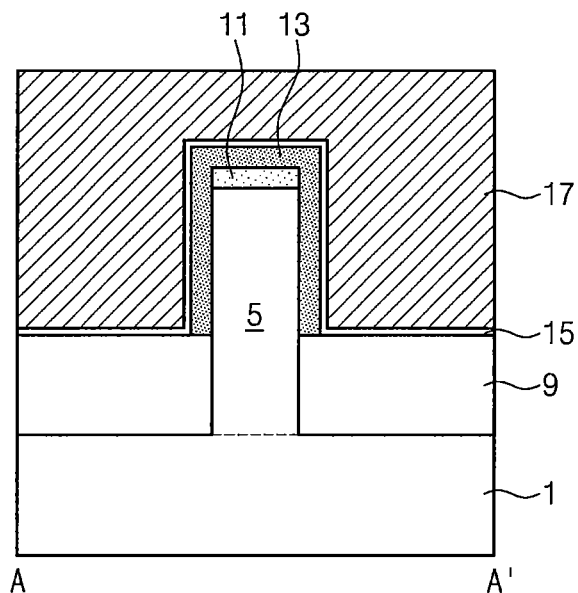
FIGS. 2A and 2B are cross-sectional views taken along a line A-A' and a line B-B' of FIG. 1, respectively.
Figure 2B:
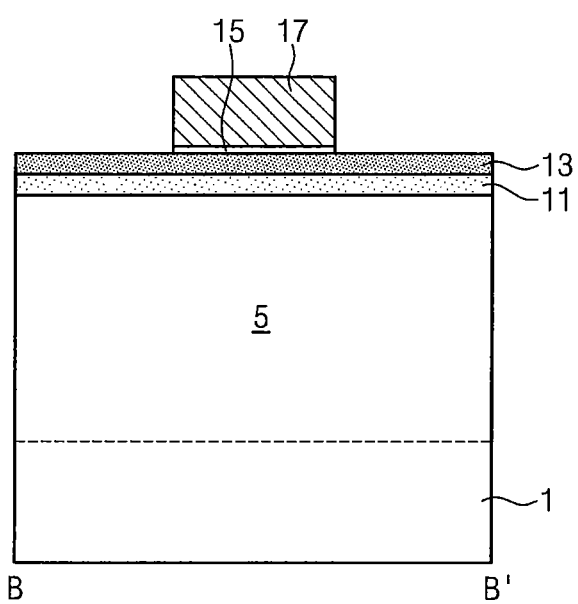
Figure 3:
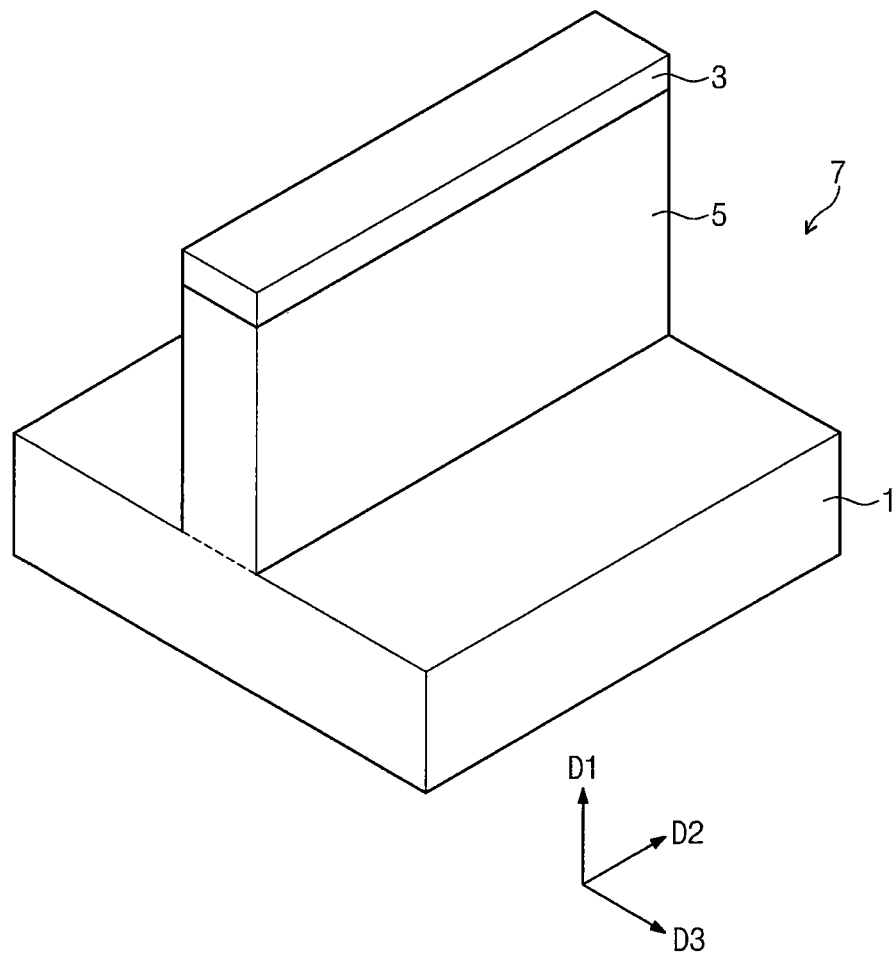
FIGS. 3 to 8 are perspective views illustrating methods of fabricating the fin field effect transistor of FIG. 1.

FIG. 1 is a perspective view illustrating a fin field effect transistor according to some embodiments of the inventive concept. FIGS. 2A and 2B are cross-sectional views taken along a line A-A' and a line B-B' of FIG. 1, respectively.

Referring to FIGS. 1, 2A, and 2B, a fin body 5 (sometimes referred to herein as a "fin") protrudes from a substrate 1 in a first direction D1. The fin body 5 may be formed of the same semiconductor material as the substrate 1 and may have the same lattice size as the substrate 1. For example, the substrate 1 and the fin body 5 may be formed of single-crystalline silicon. The fin body 5 may have a longish shape in a second direction D2 perpendicular to the first direction D1. A lower sidewall of the fin body 5 is covered by a device isolation layer 9, whereas upper side walls of the fin body 5 are exposed.

A top surface of the fin body 5 is covered by a first epitaxial layer 11. The first epitaxial layer 11 may be formed of a semiconductor material having a lattice size different from that of the fin body 5. If the fin body 5 is formed of single-crystalline silicon, for example, the first epitaxial layer 11 may be formed of one of silicon-germanium (SiGe), germanium (Ge), carbon (C), and silicon carbide (SiC). If the first epitaxial layer 11 is formed of silicon-germanium or germanium having the lattice size greater than that of the fin body 5, a tensile stress may be applied to the top surface of the fin body 5 and a compressive stress may be applied to the first epitaxial layer 11. The first epitaxial layer 11 may be absent from the upper sidewalls of the fin body 5.

A second epitaxial layer 13 is in contact with the upper side walls of the fin body 5. For example, the second epitaxial layer 13 may be in contact with both upper sidewalls of the fin body 5. The second epitaxial layer 13 may be formed of a semiconductor material having a lattice size different from that of the fin body 5. Additionally, the lattice size of the second epitaxial layer 13 may also be different from that of the first epitaxial layer 11. If the fin body 5 is formed of single-crystalline silicon and the first epitaxial layer 11 is formed of silicon-germanium or germanium having the lattice greater than that of the fin body 5, the second epitaxial layer 13 may be formed of one of carbon and silicon carbide having a lattice size less than that of the fin body 5. The second epitaxial layer 13 may extend to cover sidewalls and a top surface of the first epitaxial layer 11.

A bi-axial compressive stress may be applied to both upper sidewalls of the fin body 5 and the tensile stress may be applied to the second epitaxial layer 13. In other embodiments, the first epitaxial layer 11 may have a lattice size less than that of the fin body 5 and the second epitaxial layer 13 may have a lattice size greater than that of the fin body 5. In still other embodiments, the first epitaxial layer 11 and the second epitaxial layer 13 may be formed of the same semiconductor material having the same lattice size. Various stresses may be applied to the top surface and the upper sidewalls of the fin body 5 by the first epitaxial layer 11 and the second epitaxial layer 13, so that a carrier mobility characteristic may be variously controlled and/or improved.

A gate electrode 17 extending in a third direction D3 crossing the second direction D2 is disposed on the second epitaxial layer 13. The gate electrode 17 crosses over the fin body 5. The gate electrode 17 surrounds the top surface and both upper sidewalls of the fin body 5 thereunder. The gate electrode 17 may include at least one of poly-silicon doped with dopants, metal silicide, and a metal layer. A gate insulating layer 15 may be disposed between the gate electrode 17 and the second epitaxial layer 13. The gate insulating layer 15 may be a silicon oxide layer or a metal oxide layer having a dielectric constant higher than that of the silicon oxide layer. Source/drain regions doped with dopants may be disposed in the second epitaxial layer 13, the first epitaxial layer 11, and the fin body 5 at both sides of the gate electrode 17.

The second epitaxial layer 13, the first epitaxial layer 11, and the fin body 5, that are overlapped with the gate electrode 17, may correspond to a channel region. Due to different lattice sizes of the second epitaxial layer 13, the first epitaxial layer 11, and the fin body 5 in the channel region, a carrier mobility characteristic of the channel region may be variously controlled. Thus, a current level of the fin field effect transistor may be variously controlled.

Accordingly, the first and second epitaxial layers 11 and 13 can be disposed on different axially oriented surfaces of the fin body 5. For example, as shown in FIG. 1, the top surface of the fin body 5 is oriented in the axial direction defined by the third direction D3; whereas the upper sidewalls of the fin body 5 are defined by the axial direction D1. Accordingly, the first epitaxial layer 11 is disposed on a surface of the fin body 5 that is axially oriented in the direction defined by the third direction D3 whereas the upper sidewalls of the fin body 5 are oriented in the direction of the axis defined by the first direction D 1. Accordingly, the two different epitaxial layers 11 and 13 are on different surfaces that are oriented differently.

FIGS. 3 to 8 are perspective views illustrating methods of fabricating the fin field effect transistor of FIG. 1.

Referring to FIG. 1, a mask pattern 3 is formed on a substrate 1. The mask pattern 3 may be formed of, for example, a silicon nitride layer. The mask pattern 3 may have a linear shape extending in a second direction D2. The substrate 1 is etched using the mask pattern 3 as an etch mask to form a fin body 5 (i.e., fin) and trenches 7 at both sides thereof. The fin body 5 protrudes from the substrate 1.

Figure 4:
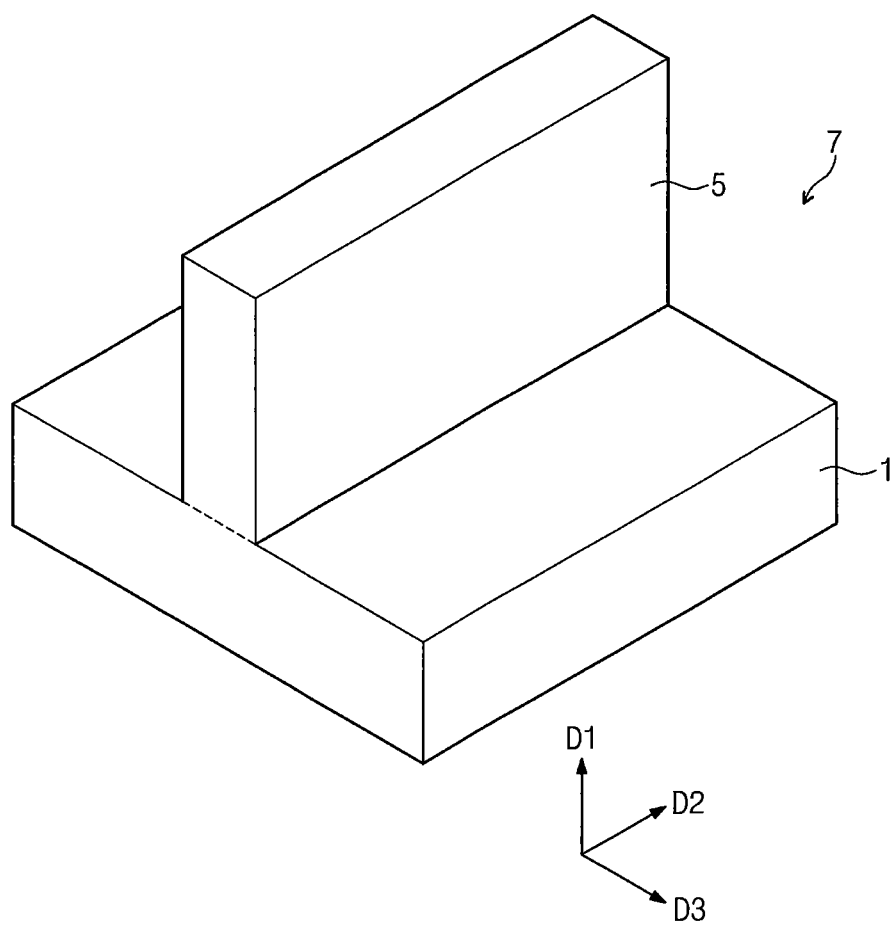
Figure 5:
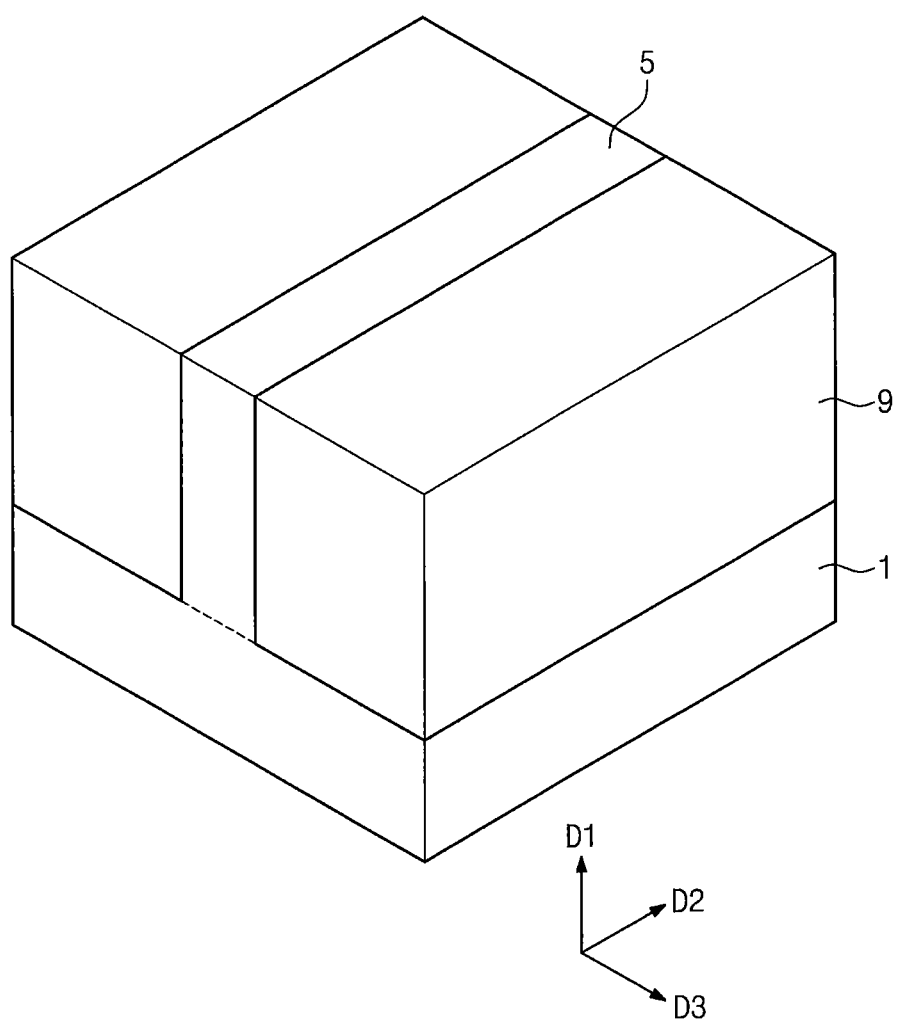

Referring to FIGS. 4 and 5, the mask pattern 3 is selectively removed to expose a top surface of the fin body 5. After a device isolation layer 9 is formed to fill the trenches 7, a planarization etching process is performed to expose the top surface of the fin body 5. For example, the device isolation layer 9 may include at least one of a silicon nitride layer, a silicon oxide layer, and a silicon oxynitride layer.

Alternatively, after the device isolation layer 9 is formed to fill the trenches 7, the planarization etching process may be performed and then the mask pattern 3 may be removed to expose the top surface of the fin body 5.

Figure 6:
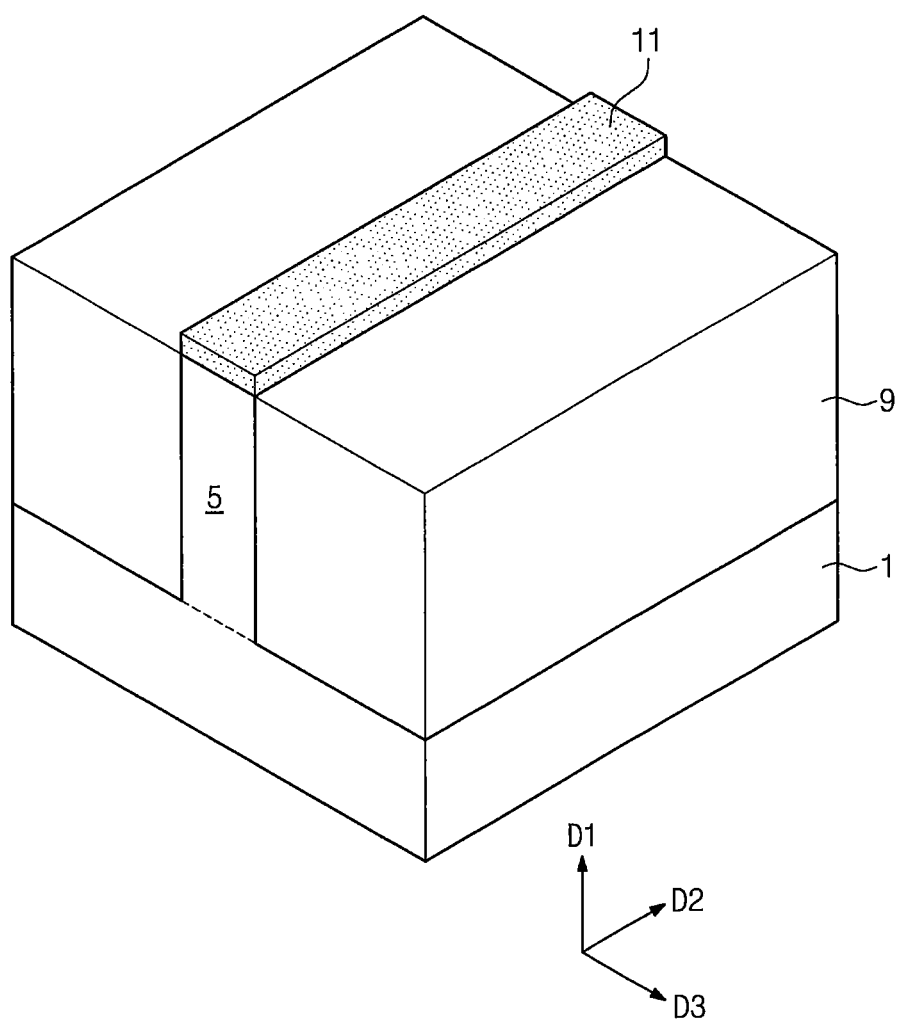

Referring to FIG. 6, a first epitaxial layer 11 is formed on the exposed top surface of the fin body 5. The first epitaxial layer 11 may be formed by a selective epitaxial growth (SEG) process. If the fin body 5 is formed of single-crystalline silicon, the first epitaxial layer 11 may be formed of one of, for example, silicon-germanium (SiGe), germanium (Ge), carbon (C), and silicon carbide (SiC).

Figure 7:
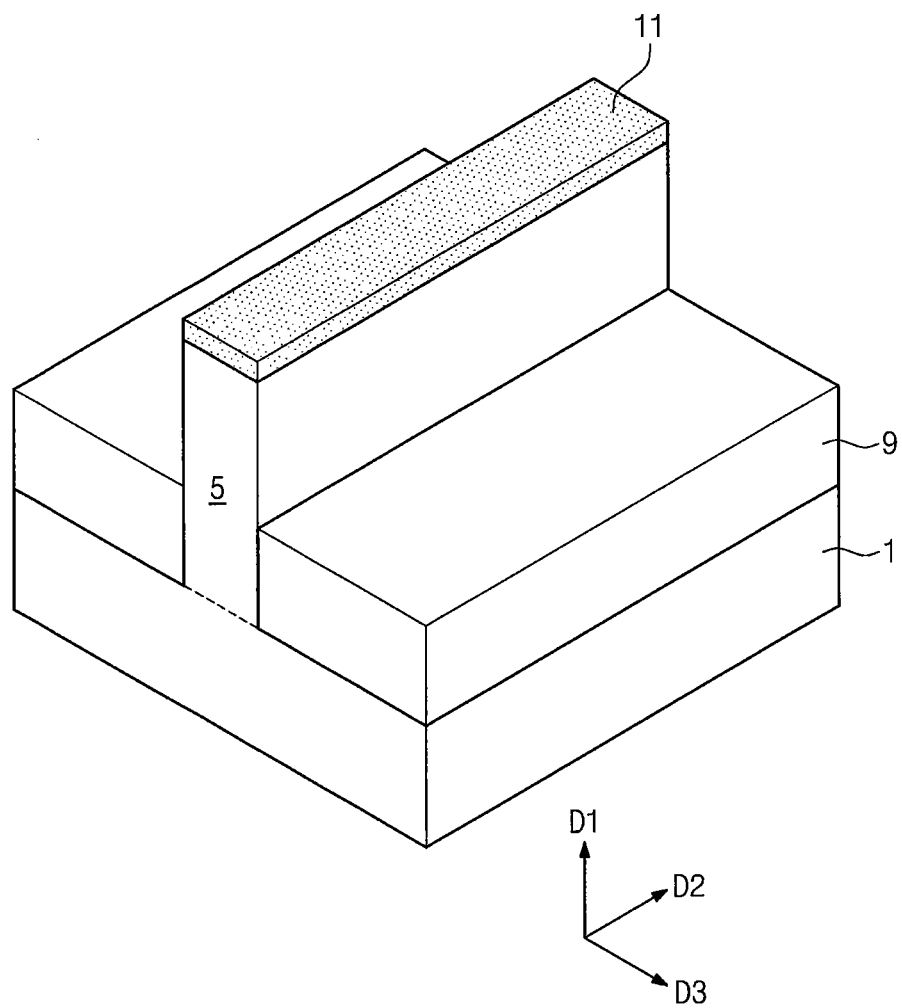
Figure 8:
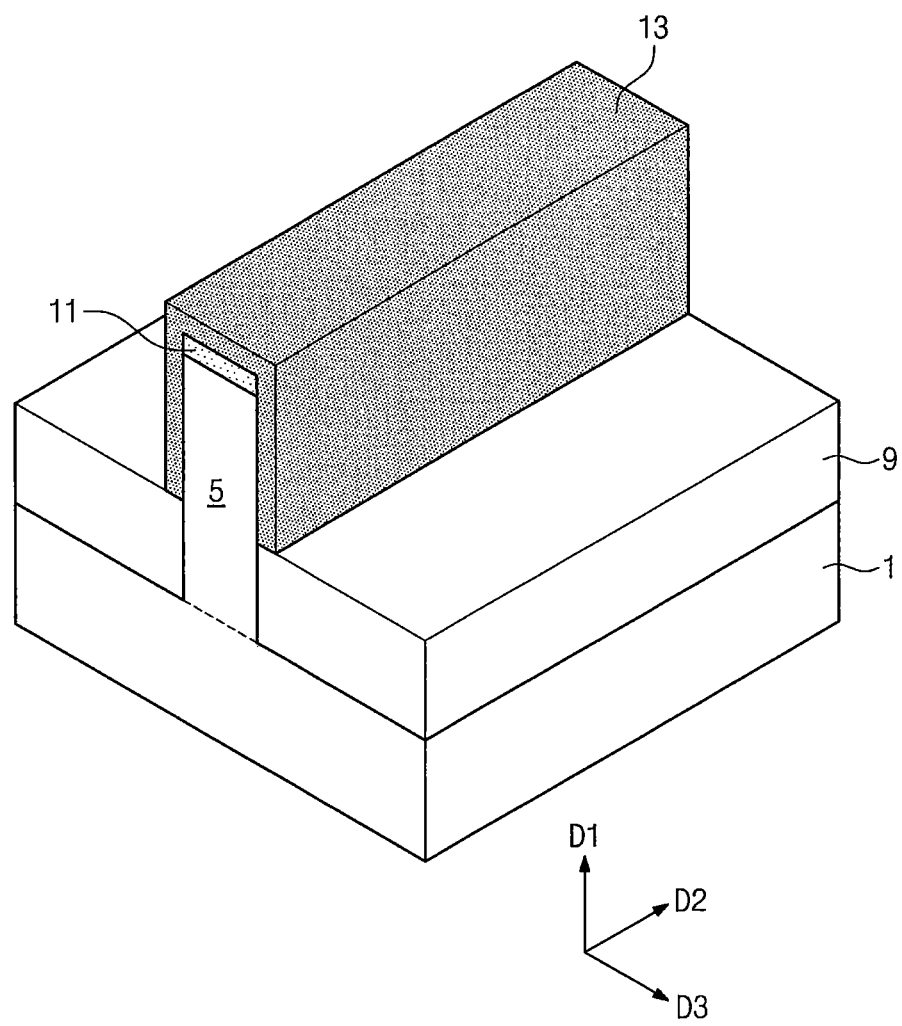

Referring to FIGS. 7 and 8, an upper portion of the device isolation layer 9 at both sides of the fin body 5 may be recessed to expose both upper sidewalls of the fin body 5. A second epitaxial layer 13 is formed to cover the exposed sidewalls of the fin body 5 and a top surface and both sidewalls of the first epitaxial layer 11. The second epitaxial layer 13 may also be formed by a SEG process. For example, the second epitaxial layer 13 may be formed of one of silicon-germanium (SiGe), germanium (Ge), carbon (C), and silicon carbide (SiC).

Referring to FIG. 1, a gate insulating layer 15 is formed to cover a top surface and sidewalls of the second epitaxial layer 13 and a gate conductive layer is stacked on the gate insulating layer 15. The gate conductive layer is patterned to form a gate electrode 17. Subsequently, dopants are injected into the second epitaxial layer 13, the first epitaxial layer 11, and the fin body 5 at both sides of the gate electrode 17 using the gate electrode 17 as an ion implantation mask, thereby forming source/drain regions.

A metal silicide layer may be additionally disposed on the second epitaxial layer 13.

Figure 9:
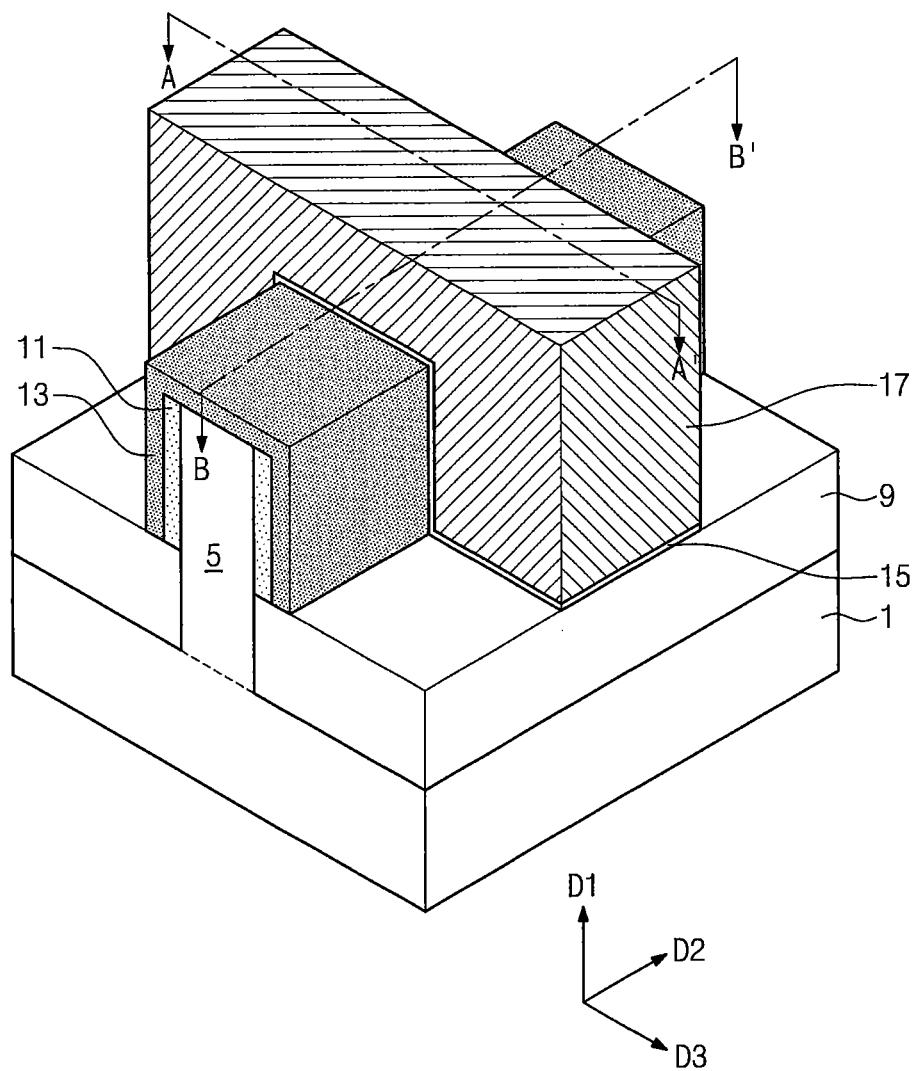
FIG. 9 is a perspective view illustrating a fin field effect transistor according to some embodiments of the inventive concept.
Figure 10A:
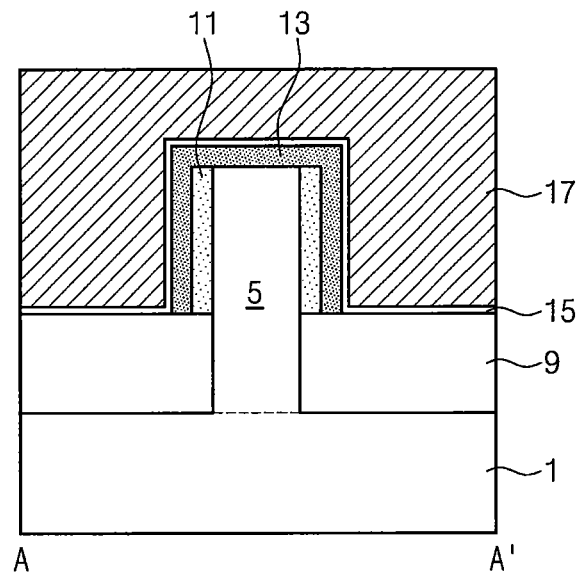
FIGS. 10A and 10B are cross-sectional views taken along a line A-A' and a line B-B' of FIG. 9, respectively.
Figure 10B:
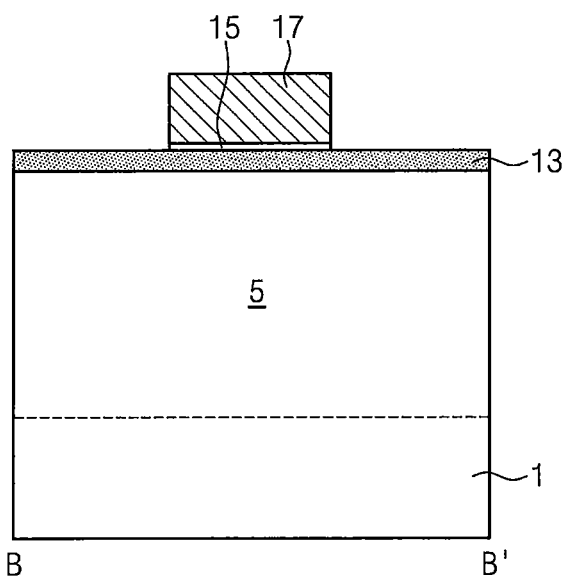

FIG. 9 is a perspective view illustrating a fin field effect transistor according to some embodiments of the inventive concept. FIGS. 10A and 10B are cross-sectional views taken along a line A-A' and a line B-B' of FIG. 9, respectively.

Referring to FIGS. 9, 10A, and 10B, an upper sidewall of a fin body 5 may be in contact with a first epitaxial layer 11 and a top surface of the fin body 5 may be in contact with a second epitaxial layer 13. The second epitaxial layer 13 may extend to cover a top surface and a sidewall of the first epitaxial layer 11. Other elements of the fin field effect transistor in the present embodiment may be the same as corresponding elements described with reference to FIG. 1.

FIGS. 11 to 15 are perspective views illustrating a method of fabricating the fin field effect transistor of FIG. 9.

Figure 11:
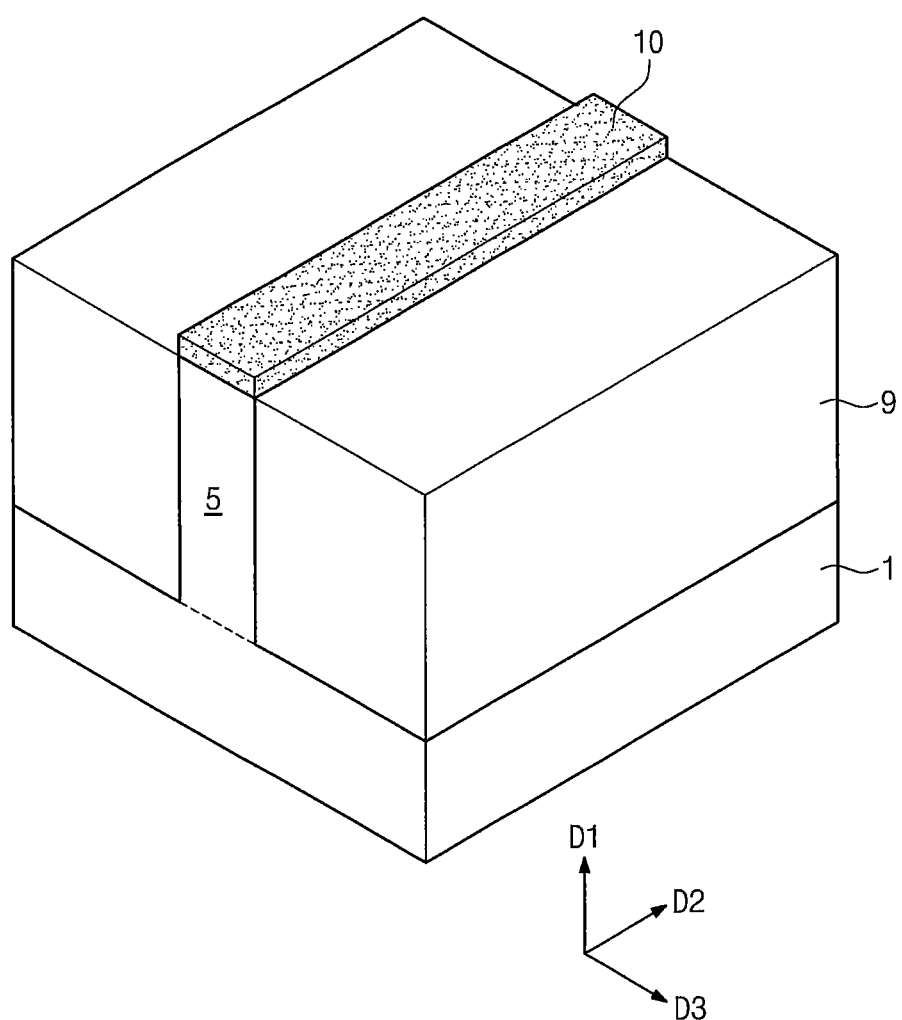
FIGS. 11 to 15 are perspective views illustrating a method of fabricating the fin field effect transistor of FIG. 9.

Referring to FIG. 11, a mask pattern 10 may be formed to cover the top surface of the fin body 5 in the structure of FIG. 5. Alternatively, the mask pattern 3 may not be removed in the structure of FIG. 3 and then the device isolation layer 9 of FIG. 5 may be formed.

Figure 12:
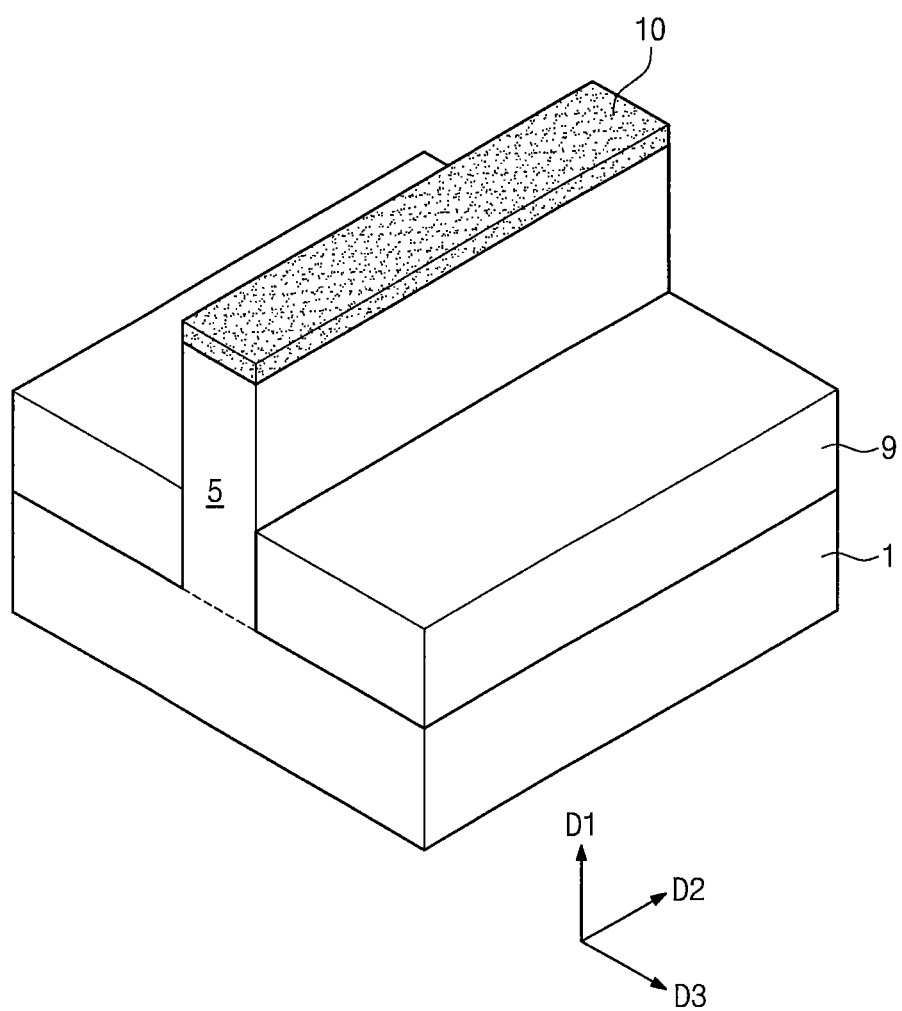

Referring to FIG. 12, an upper portion of the device isolation layer 9 may be recessed using the mask pattern 10 as an etch mask to expose upper sidewalls of the fin body 5.

Figure 13:
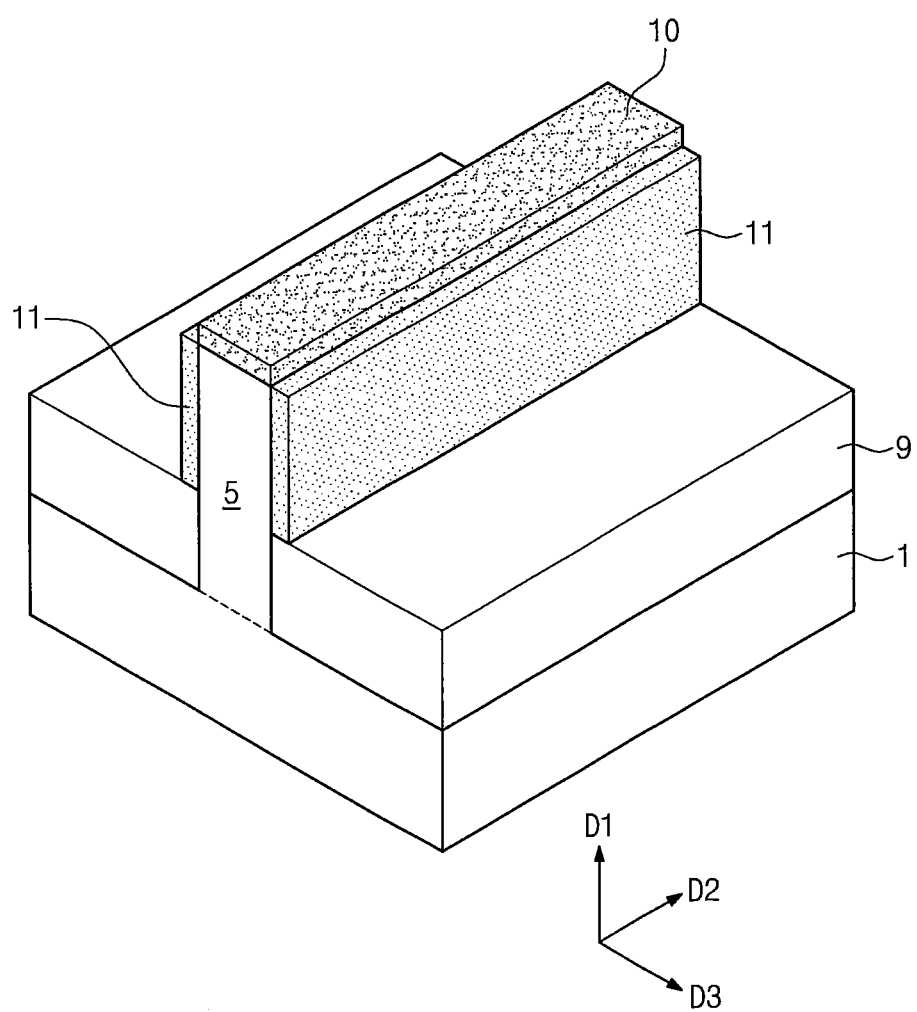

Referring to FIG. 13, a first epitaxial layer 11 is selectively formed on the exposed upper sidewalls of the fin body 5. The first epitaxial layer 11 may be formed by a SEG process. The first epitaxial layer 11 is not grown on surfaces of the mask pattern 10 and the device isolation layer 9. For example, the first epitaxial layer 11 may be formed of one of silicon-germanium (SiGe), germanium (Ge), carbon (C), and silicon carbide (SiC).

Figure 14:
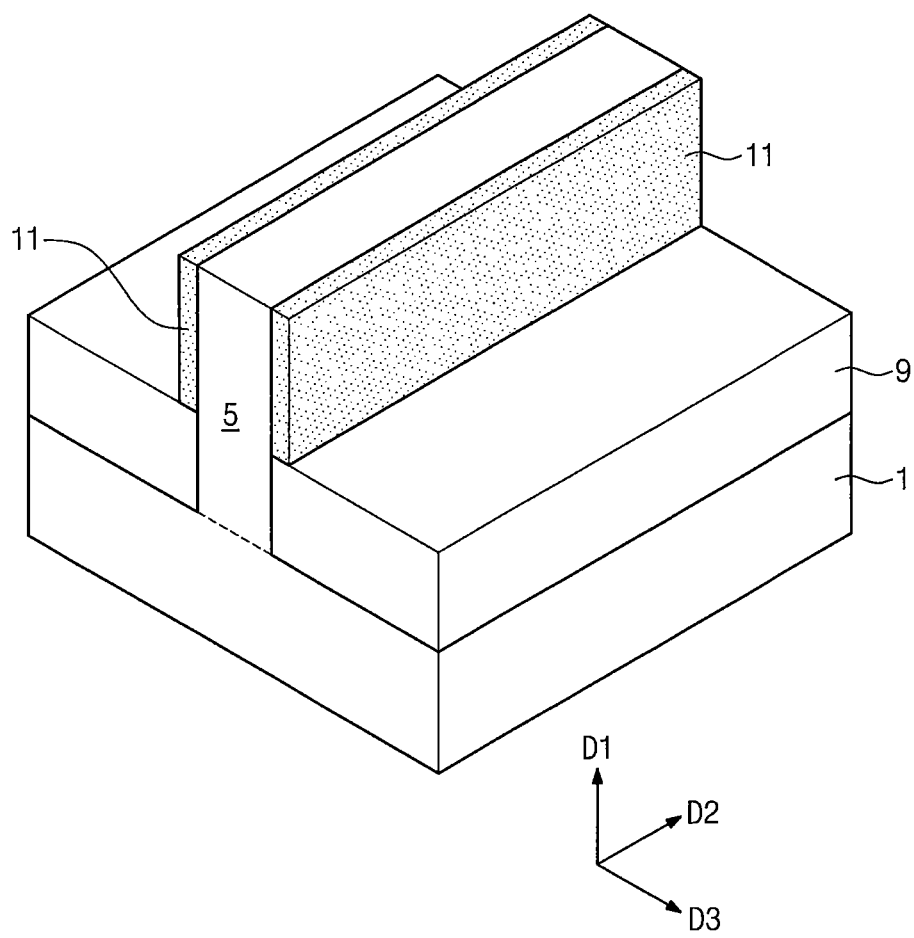

Referring to FIG. 14, the mask pattern 10 is selectively removed to expose the top surface of the fin body 5.

Figure 15:
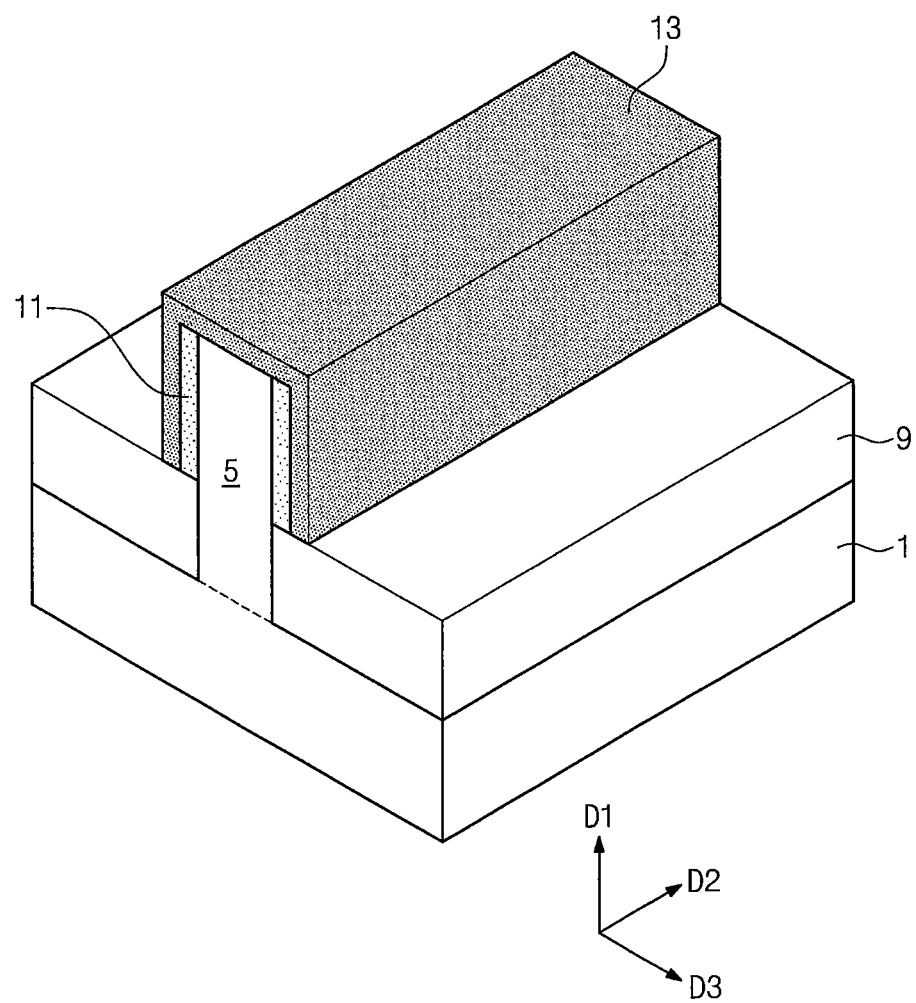

Referring to FIG. 15, a second epitaxial layer 13 is formed to cover the exposed top surface of the fin body 5 and a top surface and a sidewall of the first epitaxial layer 11. For example, the second epitaxial layer 13 may be formed of one of silicon-germanium (SiGe), germanium (Ge), carbon (C), and silicon carbide (SiC).

Other processes may be the same as/similar to the corresponding processes described above.

Figure 16:
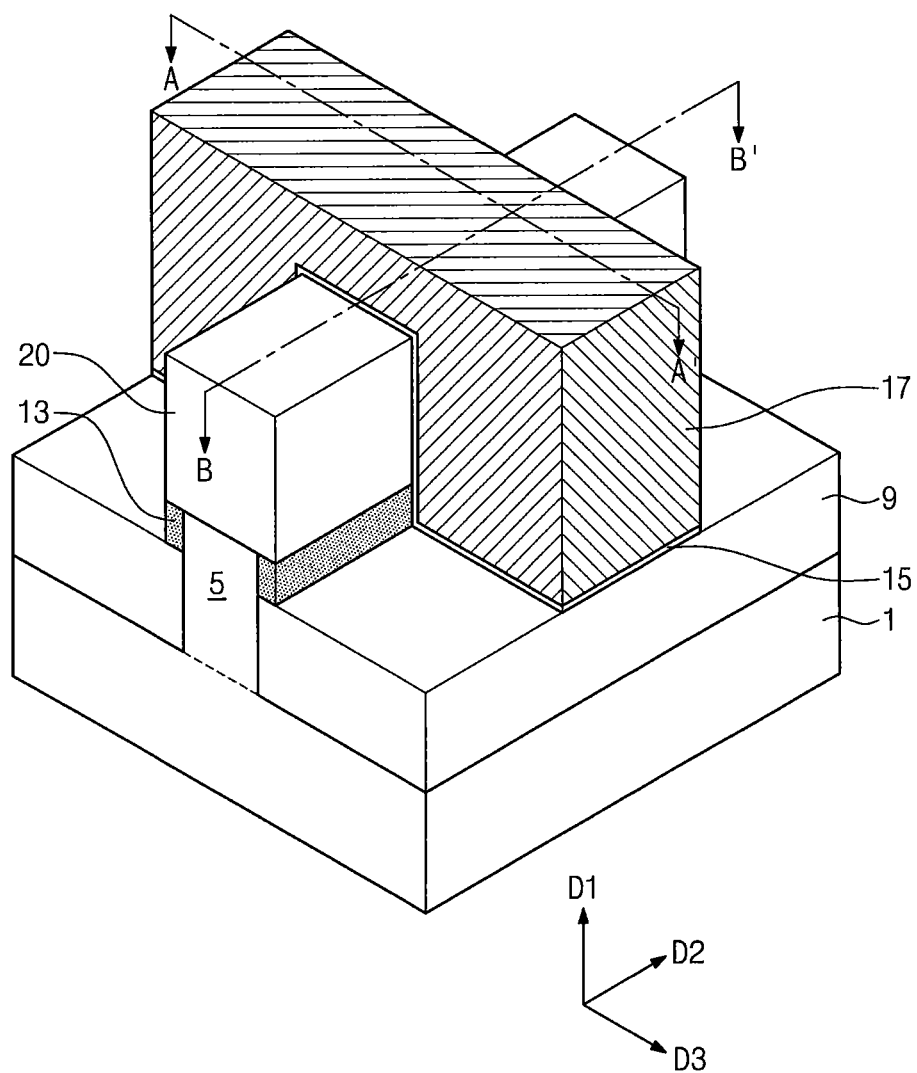
FIG. 16 is a perspective view illustrating a fin field effect transistor according to some embodiments of the inventive concept.
Figure 17:
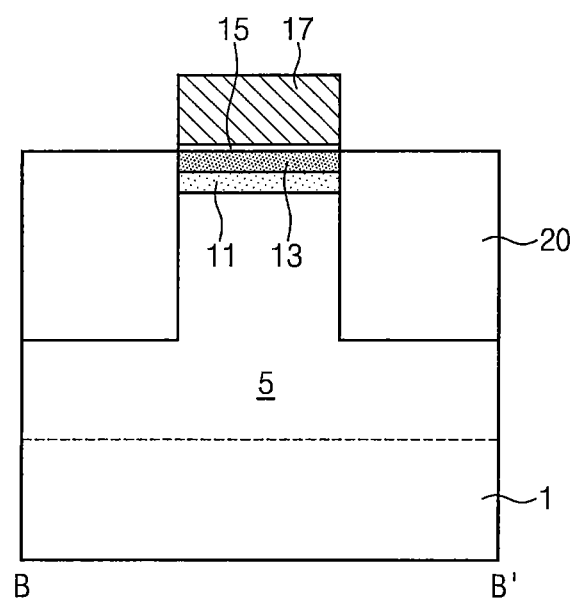
FIG. 17 is a cross-sectional view taken along a line B-B' of FIG. 16.

FIG. 16 is a perspective view illustrating a fin field effect transistor according to still other embodiments of the inventive concept. FIG. 17 is a cross-sectional view taken along a line B-B' of FIG. 16.

Referring to FIGS. 16 and 17, in the structure of FIG. 1, upper portions of the fin body 5 and upper portions of the second epitaxial layer 13 disposed at both sides of the gate electrode 17 are recessed. A third epitaxial layer 20 is disposed on the recessed top surfaces of the fin body 5 and the second epitaxial layer 13. The third epitaxial layer 20 may include a semiconductor material having a lattice size different from that of the fin body 5. The lattice size of the third epitaxial layer 20 may be equal to at least one of those of the first and second epitaxial layers 11 and 13. Alternatively, the lattice size of the third epitaxial layer 20 may be different from all lattice sizes of the first and second epitaxial layers 11 and 13. The third epitaxial layer 20 may be doped with dopants, so that the third epitaxial layer 20 doped with the dopants may function as a source/drain region. The dopants of the third epitaxial layer 20 may be doped in situ during the formation of the third epitaxial layer 20.

It will be understood that a cross-sectional view taken along a line A-A' of FIG. 16 is the same as that shown in FIG. 2A. Thus, the structure under the gate electrode 17 in FIGS. 16 and 17 is the same as the structure described with reference to FIGS. 1 and 2A.

A method of fabricating the fin field effect transistor of FIGS. 16 and 17 may be described as follows. First, in the structure of FIG. 1, a mask layer may be formed to cover an entire surface of the substrate 1 and then the mask layer may be patterned to form an opening exposing the second epitaxial layer 13 disposed at both sides of the gate electrode 17. After the second epitaxial layer 13, the first epitaxial layer 11, and the upper portion of the fin body 5 may be partially recessed, a third epitaxial layer 20 may be formed on the recessed region by a SEG process.

Figure 18:
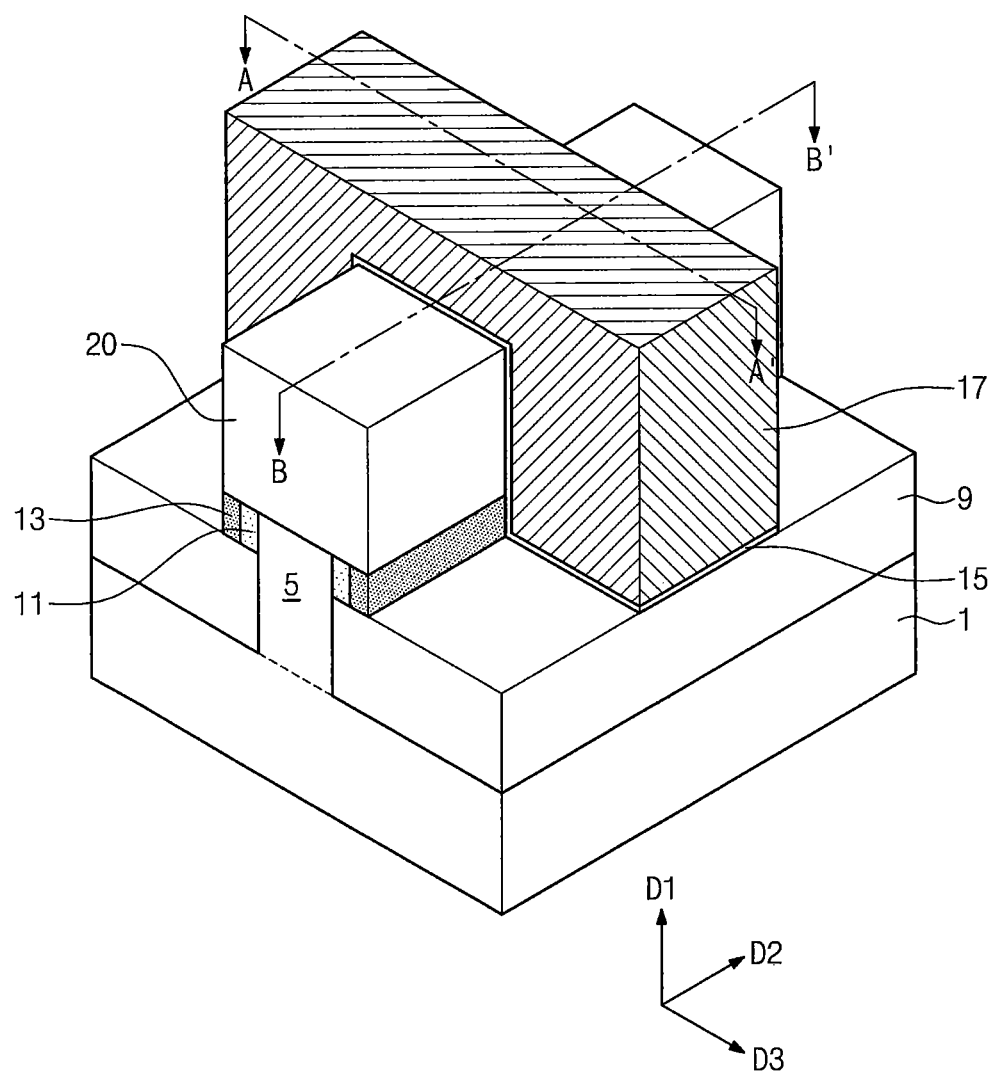
FIG. 18 is a perspective view illustrating a fin field effect transistor according to some embodiments of the inventive concept.
Figure 19:
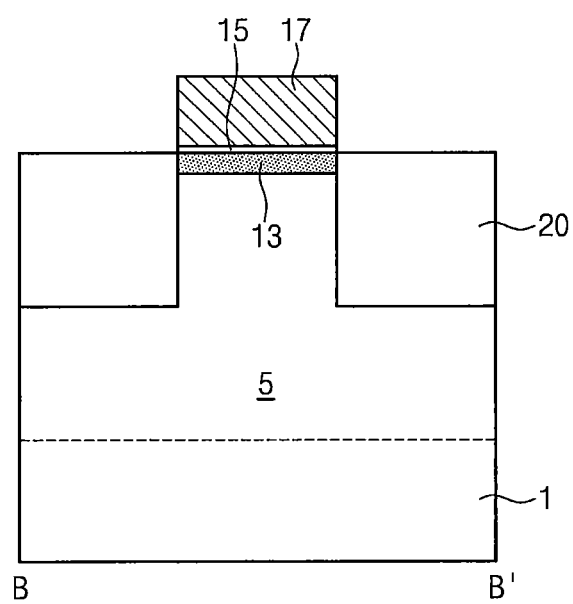
FIG. 19 is a cross-sectional view taken along a line B-B' of FIG. 18.

FIG. 18 is a perspective view illustrating a fin field effect transistor according to yet other embodiments of the inventive concept. FIG. 19 is a cross-sectional view taken along a line B-B' of FIG. 18.

Referring to FIGS. 18 and 19, in the structure of FIG. 9, upper portions of the fin body 5, the first epitaxial layer 11, and the second epitaxial layer 13 disposed at both sides of the gate electrode 17 are recessed. A third epitaxial layer 20 may be disposed on the top surfaces of the recessed fin body 5, the recessed first epitaxial layer 11, and the recessed second epitaxial layer 13. The third epitaxial layer 20 may include a semiconductor material having a lattice size different from that of the fin body 5. The lattice size of the third epitaxial layer 20 may be equal to at least one of those of the first and second epitaxial layers 11 and 13. Alternatively, the lattice size of the third epitaxial layer 20 may be different from all lattice sizes of the first and second epitaxial layers 11 and 13. The third epitaxial layer 20 may be doped with dopants, so that the third epitaxial layer 20 doped with the dopants may function as a source/drain region. The dopants of the third epitaxial layer 20 may be doped in situ during the formation of the third epitaxial layer 20.

A cross-sectional view taken along a line A-A' of FIG. 18 is the same as FIG. 10A. Thus, the structure under the gate electrode 17 in FIGS. 18 and 19 is the same as the structure described with reference to FIGS. 9 and 10A.

A method of fabricating the fin field effect transistor of FIGS. 18 and 19 may be described as follows. First, in the structure of FIG. 9, a mask layer may be formed to cover an entire surface of the substrate 1 and then the mask layer may be patterned to form an opening exposing the second epitaxial layer 13 disposed at both sides of the gate electrode 17. After the second epitaxial layer 13, the first epitaxial layer 11, and the upper portion of the fin body 5 may be partially recessed, a third epitaxial layer 20 may be formed on the recessed region by a SEG process.

Figure 20A:
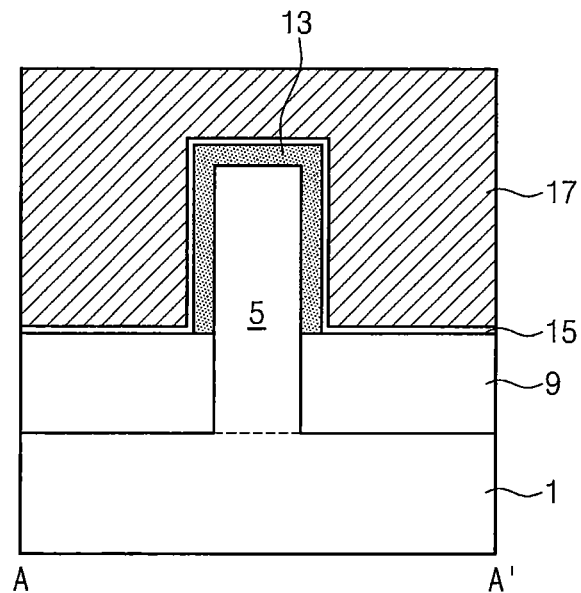
FIG. 20A is a cross-sectional view taken along line A-A' in FIG. 16 in some embodiments according to the inventive concept.
Figure 20B:
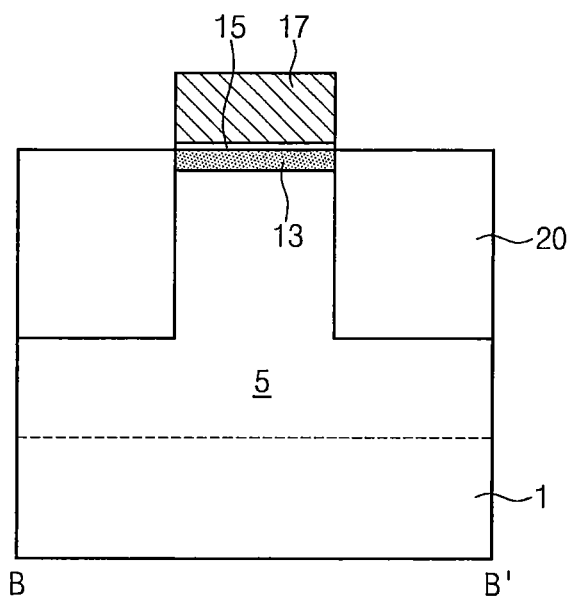
FIG. 20B is a cross-sectional view taken along line B-B' in FIG. 16 in some embodiments according to the inventive concept.

FIGS. 20A and 20B are cross-sectional views taken along lines A-A' and B-B' respectively of FIG. 16 in some embodiments according to the invention. More particularly, the cross-sectional views shown in FIGS. 20A and 20B illustrate embodiments according to the inventive concept other than those originally illustrated in FIG. 16 but are otherwise the same as the perspective view shown therein.

According to FIGS. 20A and 20B, in the structure of FIG. 16, upper portions of the fin body 5 and upper portions of the second epitaxial layer 13 disposed on both sides of the gate electrode 17 are recessed. The third epitaxial layer 20 is disposed on the recessed top surfaces of the fin body 5 and the second epitaxial layer 13. The third epitaxial layer 20 may include a semiconductor material having a lattice size different from that of the fin body 5. The lattice size of the third epitaxial layer 20 may be equal to that of the second epitaxial layer 13. Alternatively, the lattice size of the third epitaxial layer 20 may be different from that of the second epitaxial layer 13. The third epitaxial layer 20 may be doped with dopants, so that the third epitaxial layer 20 doped with dopants may function as a source/drain region. The dopants of the third epitaxial layer 20 may be doped in situ during the formation of the third epitaxial layer 20. The first epitaxial layer 11 (shown, for example, in FIG. 17) is absent from the embodiments illustrated in FIGS. 20A and 20B. Otherwise the structures shown in FIGS. 16 and 17 are similar to those illustrated in FIGS. 20A and 20B in some embodiments according to the invention.

Figure 21:
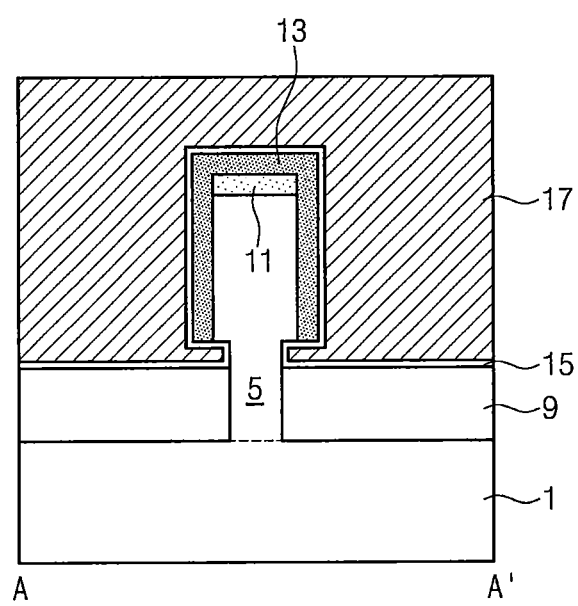
FIG. 21 is a cross-sectional view of an omega-shaped gate structure in some embodiments according to the inventive concept.

Although the portions of the structures described herein take the form of a fin, it will be understood that some embodiments according to the inventive concept can also be provided in the form of omega shaped silicon structures, such as those illustrated in FIG. 21, where the fin 5 takes the form of an omega shaped letter having a neck portion adjacent to the substrate which is narrower than an upper portion of the body of the omega shaped silicon structure. The second epitaxial layer 13 is disposed on both upper side walls and the top surface of the omega shaped silicon structure 5. The first epitaxial layer 11 is disposed on the top surface of the omega shaped silicon structure 5 beneath the second epitaxial layer 13. The first and second epitaxial layers 11 and 13 may include a semiconductor material having a lattice size different from that of the omega shaped silicon structure 5. The gate structure 17 crosses over the omega shaped silicon structure 5. It will be understood that the embodiments illustrated by FIG. 21 can also include the various layers and features associated with the other embodiments described herein.

In the fin field effect transistor according to embodiments of the inventive concept, the top surface and a sidewall of the fin body are in contact with the first epitaxial layer and the second epitaxial layer, respectively, and the first and second epitaxial layers have lattice sizes different from that of the fin body. Thus, stresses different from each other may be applied to the fin body. As a result, a mobility characteristic may be variously controlled.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed:

1. A Field Effect Transistor (FET) structure, comprising:
a fin on a substrate comprising a first lattice constant; and
at least two different lattice constant layers on respective different axially oriented surfaces of the fin, wherein the at least two different lattice constant layers each comprise lattice constants that are different than the first lattice constant and each other;
wherein the fin extends from the substrate to protrude from a device isolation layer on the substrate to provide upper side walls of the fin to provide a first axially oriented surface and a top surface of the fin to provide a second axially oriented surface and a channel region, the structure further comprising:
a gate structure crossing over the fin opposite the channel region;
a first epi layer on the top surface of the fin comprising a second lattice constant different than the first lattice constant; and
a second epi layer, on the upper side walls of the fin, comprising a third lattice constant different than the first and second lattice constants, wherein the first epi layer covers the second epi layer on the upper side walls and the second epi layer is absent from the top surface of the fin, wherein the fin includes source/drain interfaces at opposing ends of the channel region, the structure further comprising:
source/drain regions, comprising a third epi layer including a fourth lattice constant different than the first, second, and third lattice constants, extending from the source/drain interfaces outward from the gate structure to cover the top surface of the fin exposed by the gate structure.

2. A Field Effect Transistor (FET) structure, comprising:
a device isolation layer on a substrate;
a fin comprising a first lattice constant, the fin extending from the substrate to protrude from the device isolation layer to provide upper side walls of the fin, a top surface of the fin, a channel region, and source/drain interfaces at opposing ends of the channel region;
a gate structure crossing over the fin opposite the channel region between the source/drain interfaces;
a first epi layer on the upper side walls of the fin comprising a second lattice constant different than the first lattice constant;
a second epi layer, on the top surface of the fin, comprising a third lattice constant different than the first and second lattice constants; and
source/drain regions, comprising a third epi layer including a fourth lattice constant different than the first, second, and third lattice constants, extending from the source/drain interfaces outward from the gate structure to cover the top surface of the fin exposed by the gate structure.

3. The structure of claim 2 wherein the first epi layer is absent from the top surface of the fin and the first and second epi layers are absent from a top surface and side walls of the source/drain regions.

4. A Field Effect Transistor (FET) structure, comprising:
a device isolation layer on a substrate;
a fin comprising a first lattice constant, the fin extending from the substrate to protrude from the device isolation layer to provide upper side walls of the fin and a top surface of the fin and a channel region;
a gate structure crossing over the fin opposite the channel region;
a first epi layer on the top surface of the fin comprising a second lattice constant different than the first lattice constant; and
a second epi layer, on the upper side walls of the fin, comprising a third lattice constant different than the first and second lattice constants, wherein the first epi layer covers the second epi layer on the upper side walls and the second epi layer is absent from the top surface of the fin, wherein the fin includes source/drain interfaces at opposing ends of the channel region, the structure further comprising:
source/drain regions, comprising a third epi layer including a fourth lattice constant different than the first, second, and third lattice constants, extending from the source/drain interfaces outward from the gate structure to cover the top surface of the fin exposed by the gate structure.

* * * * *